United States Patent [19]

O'Neill

[11] 4,243,472

[45] Jan. 6, 1981

[54] METHOD FOR LIQUID PHASE EPITAXY MULTIPLE DIPPING OF WAFERS FOR BUBBLE FILM GROWTH

[75] Inventor: Charles F. O'Neill, Escondido, Calif.

[73] Assignee: Burroughs Corporation, Detroit, Mich.

[21] Appl. No.: 16,883

[22] Filed: Mar. 2, 1979

[51] Int. Cl.³ .............................................. C30B 19/04
[52] U.S. Cl. ............................ 156/624; 156/DIG. 98; 23/301
[58] Field of Search ....... 156/624, DIG. 84, DIG. 98; 422/245, 254, 248; 23/301; 269/46

[56] References Cited

U.S. PATENT DOCUMENTS

| 2,793,941 | 5/1957 | Estes | 23/301 R |
|---|---|---|---|
| 3,647,578 | 3/1972 | Barnett et al. | 156/624 |
| 3,677,718 | 7/1972 | Lawless | 156/624 |
| 4,077,832 | 3/1978 | Robertson et al. | 156/624 |
| 4,092,208 | 5/1978 | Brice et al. | 156/624 |
| 4,191,365 | 3/1980 | O'Neill | 269/46 |

FOREIGN PATENT DOCUMENTS

| 508532 | 12/1954 | Canada | 23/301 R |
|---|---|---|---|
| 4843426 | 12/1973 | Japan | 422/248 |

Primary Examiner—Frank W. Lutter
Assistant Examiner—Gregory N. Clements
Attorney, Agent, or Firm—Joseph R. Dwyer; Mervyn L. Young; Kevin R. Peterson

[57] ABSTRACT

A method for batch processing wafers by liquid phase epitaxy (LPE) dipping methods for uniformity of film thickness wafer-to-wafer and uniformity of film on each individual wafer for use in bubble (domain) memories comprising, supporting a plurality of wafers substantially horizontal on a substrate holder and lowering and immersing said wafers into the melt to be deposited as a thin film on each wafer and, while immersed, continually moving the wafers up and down as well as continually oscillating the wafers through substantially 360°.

5 Claims, 4 Drawing Figures

METHOD FOR LIQUID PHASE EPITAXY MULTIPLE DIPPING OF WAFERS FOR BUBBLE FILM GROWTH

CROSS REFERENCE TO RELATED APPLICATION

Application for U.S. patent entitled "Horizontal/Inclined Substrate Holder for Liquid Phase Epitaxy" by Charles Francis O'Neill filed Mar. 2, 1979, Ser. No. 016,884 now U.S. Pat. No. 4,191,365.

BACKGROUND OF THE INVENTION

This invention relates to a liquid phase epitaxy (LPE) technique and in particular to a means for growing garnet film on a plurality of substrates simultaneously.

Liquid phase epitaxy for growing magnetic garnets utilizing a technique of dipping non-magnetic substrates in a supersaturated solution to provide large area films for bubble domain devices is old. An article entitled "The Growth of Magnetic Garnets by Liquid Phase Epitaxy" by Blank et al, *Journal of Crystal Growth*, Vol. 17, pp. 302–311 of 1972 discusses a substrate vertically fixed on a substrate holder and lowering the substrate into a crucible having a melt and rotating said substrate while in said melt. The article entitled "Liquid Phase Epitaxial Growth of Magnetic Garnet Films by Isothermal Dipping in a Horizontal Plane with Axial Rotation" by Giess et al, *Journal of Crystal Growth*, Vol. 17, No. 1, October 1972, pp. 36–42 discusses the dipping of substrates disposed horizontally on a substrate holder and rotating the same in a horizontal plane while in the dip. And the U.S. Pat. No. 4,092,208 to Brice et al also discusses dipping a vertically disposed substrate in a crucible having a suitable melt. The patent also discusses dipping a horizontally disposed substrate into the melt and rotating the same in a horizontal direction.

However, the foregoing methods of growing garnet film on substrates has been found to be deficient where the processing of a plurality of wafers at one time is involved—the so-called batch processing of wafers.

Wafers produced in such a batch process have been found to vary from wafer-to-wafer in film thicknesses beyond acceptable tolerances and the films themselves on each of the wafers have been found not to be uniform, i.e., there was no uniformity in the thicknesses of the film from the middle of the wafer to the periphery thereof. Since the thickness of the film and its uniformity has a definite affect on the magnetic properties of the wafer, the wafers had to be separated according to their film thicknesses and their uniformity so that a plurality of wafers and the chips formed therefrom, when used together, would have the same magnetic properties.

Accordingly, it is a principle object of this invention to provide a method by which a plurality of wafers may be processed at one time yet provide film thicknesses wafer-to-wafer within acceptable ranges and provide a film of uniform thickness on each wafer.

SUMMARY OF THE INVENTION

The method which meets the foregoing objects comprises supporting the plurality of wafers substantially horizontal and lowering and immersing said wafers into the flux to be deposited as a thin film on each wafer and, while immersed in the melt, continually moving said wafers up and down as well as continually oscillating said wafers through substantially 360°.

BRIEF DESCRIPTION OF THE PREFERRED EMBODIMENT

Figure 1:
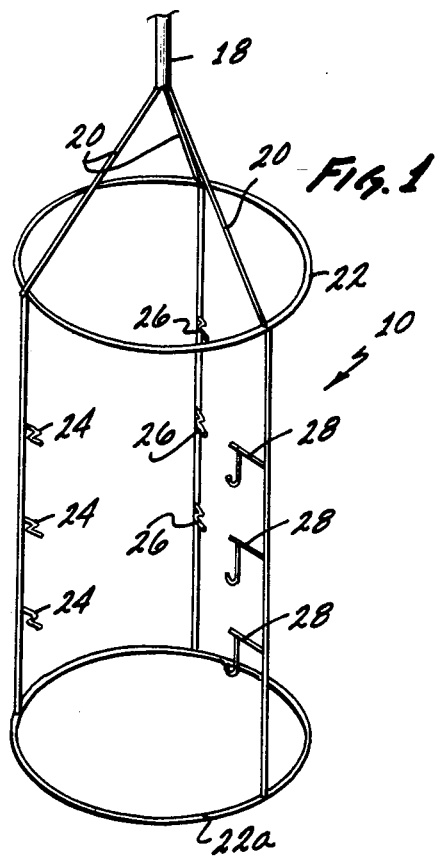
FIG. 1 shows a substrate holder for processing a plurality of wafers.
Figure 2:
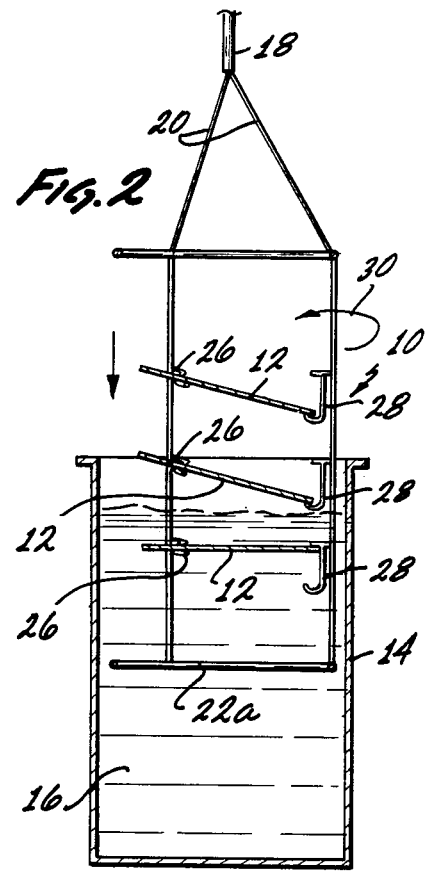
FIG. 2 shows the substrate holder with a plurality of wafers one of which is partially submerged.

The drawings show a substrate holder 10 for performing a liquid phase epitaxial growth on wafers 12 when inserted in a crucible 14 of a generally cylindrical configuration formed of suitable refractory nonreactive materials and at least partially filled with a melt material 16 to be epitaxially deposited on the substrates. Suitable means for heating the melt in the crucible and for raising, lowering and oscillating the substrate holder are, of course, provided, but are not shown in the drawings since this invention is directed to the method of batch processing a plurality of substrates.

The apparatus disclosed is simply to illustrate the preferred apparatus for practicing this inventive method; however, any apparatus capable of supporting and dipping a plurality of substrates in a melt filled crucible may be used so long as the apparatus is capable of raising, lowering and oscillating the substrate while in the flux. If more information is desired concerning the substrate holder, see the related application, supra.

Thus, the apparatus of the drawings shows the substrate holder 10 which comprises a dipping rod member 18 suitable to be connected at one end to a means for operating the holder, i.e., raising and lowering the substrates into the crucible and oscillating the substrates while in the melt. The other end of the rod is provided with substrate holding means in the form of a plurality of wires 20 which diverge and are connected to rings 22 and 22a disposed perpendicular to the axis of the rod and having diameters commensurate, respectively, with the diameters of the wafers.

A means for confining the wafers in the substrate holder comprises a plurality of hooks 24, 26 and 28 in groups of three suitably affixed to the wires and spaced apart approximately 120°. These hooks each engage and support a substrate at its periphery.

Two of the hooks 24 and 26 for each substrate extend inwardly and are S-shaped in configuration and engage the substrate such that each substrate is prevented from moving upwardly yet serves to support the substrate out of the flux. The third hook 28 of each group also has a means by which the substrate is prevented from moving upwardly in the flux and is provided with a hook to support the substrate out of the melt and at a tilt of approximately 15° from the plane of the rings 22 and 22a.

From the foregoing, it can be seen that each substrate is capable of being supported in the substrate holder in a generally tilted position, the position at which the substrates are lowered toward the melt 14 in the crucible. Since the substrates have a lower density than the melt, they have a tendency to float and to assume a horizontal position while submerged in the melt. Too, oscillating movement of the substrate in the melt tends to further orient the substrates in a horizontal plane.

Figure 4:
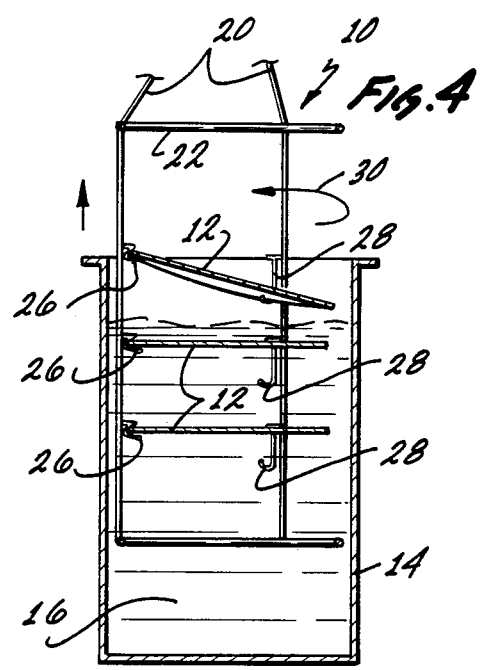
FIG. 4 shows the substrate holder being withdrawn from the flux.

During this horizontal orientation, a film of uniform thickness is grown on each of the substrates, then, as the substrate is being removed from the melt, as shown in FIG. 4, substrates will again assume the tilted position for flux runoff.

Figure 3:
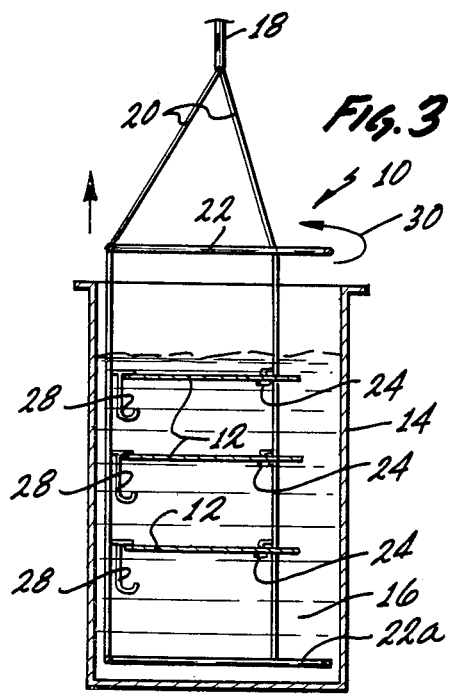
FIG. 3 shows the substrate holder with all of the substrates submerged.

Again, normally wafers produced in a batch process have been found to vary from wafer-to-wafer in film thicknesses beyond acceptable tolerances and the films themselves on each of the wafers have been found not to be uniform. However, it has been found that utilizing this method by which the wafers are continually raised and lowered while in the flux and at the same time continually oscillated approximately 360° films of uniform thicknesses wafer-to-wafer and uniform thicknesses on each wafer have been grown. This oscillation is illustrated by the arrows 30 and the different positions of the substrate holder in FIGS. 3 and 4.

What is claimed is:

1. A batch process for growing films onto nonmagnetic substrates by liquid phase epitaxy comprising:
   supporting a plurality of substrates spaced apart from each other in a tilted position, above one another and above a flux material to be deposited on said substrate,
   lowering said spaced apart substrates into the flux material where said substrates assume a horizontal position as they enter said flux material,
   continually moving said substrates while in said flux in an up and down motion and oscillating motion.

2. The process as claimed in claim 1, wherein said substrates leave said flux material in a tilted position as the substrates individually are raised out of said flux material.

3. A method for growing films on substrates by liquid phase epitaxy comprising:
   supporting a plurality of spaced apart, tilted substrates above a flux material,
   lowering said substrates into the flux material where each said substrate assumes a horizontal position as it enters said flux material, and
   continually moving said substrates up and down and oscillating said spaced apart horizontal substrates while in said flux.

4. The method as claimed in claim 3, wherein said substrates are tilted to their original tilted position when removed from said flux for flux runoff.

5. The process for growing films on substrates by liquid phase epitaxy comprising:
   supporting at least one substrate in a tilted position above a flux material to be deposited on said at least one substrate,
   lowering said at least one substrate into the flux material and allowing said at least one substrate to assume a horizontal position as said at least one substrate enters said flux material,
   continually moving said at least one substrate up and down and in an oscillating movement while in said flux, and
   tilting said at least one substrate to its original position when removing said at least one substrate from the flux.

* * * * *